(12) United States Patent
Templeton et al.

(10) Patent No.: US 6,350,559 B1
(45) Date of Patent: Feb. 26, 2002

(54) METHOD FOR CREATING THINNER RESIST COATING THAT ALSO HAS FEWER PINHOLES

(75) Inventors: Michael K. Templeton, Atherton; Kathleen R. Early, Santa Clara; Christopher F. Lyons, Fremont, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/398,642

(22) Filed: Sep. 17, 1999

(51) Int. Cl.⁷ ................................................ G03F 7/00
(52) U.S. Cl. .................... 430/322; 430/327; 216/38
(58) Field of Search ................................ 430/311, 322, 430/327; 216/38

(56) References Cited

U.S. PATENT DOCUMENTS

| | | | |
|---|---|---|---|
| 5,728,493 A | 3/1998 | Lim et al. ........................ | 430/5 |
| 5,905,019 A | * 5/1999 | Obszarny .................... | 430/327 |
| 5,977,601 A | 11/1999 | Yang et al. .................. | 257/437 |

\* cited by examiner

*Primary Examiner*—Kathleen Duda
(74) *Attorney, Agent, or Firm*—Renner, Otto, Boisselle & Sklar, LLP

(57) ABSTRACT

In one embodiment, the present invention relates to a method of forming a thin photoresist layer having a low defect density, involving the steps of depositing a photoresist layer having a thickness from greater than about 0.5 $\mu$m to about 2 $\mu$m on a semiconductor substrate; and removing at least a portion of the photoresist layer to provide the thin photoresist layer having the low defect density and a thickness from about 0.1 $\mu$m to about 0.5 $\mu$m. In another embodiment, the present invention relates to a method of reducing pinhole defects in a thin photoresist layer having a thickness below about 0.5 $\mu$m comprising a photoresist material, involving the steps of depositing a layer of the photoresist material having a thickness greater than about 0.5 $\mu$m; and etching at least a portion of the photoresist material to provide the thin photoresist layer having the thickness below about 0.5 $\mu$m, wherein the thickness of the thin photoresist layer is about 90% or less than the thickness of the layer of the photoresist material.

33 Claims, 1 Drawing Sheet

METHOD FOR CREATING THINNER RESIST COATING THAT ALSO HAS FEWER PINHOLES

TECHNICAL FIELD

The present invention generally relates to making a thin photoresist layer having a low defect density. In particular, the present invention relates to reducing, the occurrence of pinholes in thin photoresist layers.

BACKGROUND ART

Microlithography processes for making miniaturized electronic components, such as in the fabrication of computer chips and integrated circuits, involve using photoresists. Generally, a coating or film of a photoresist is applied to a substrate material, such as a silicon wafer used for making integrated circuits. The substrate may contain any number of layers or devices thereon. The photoresist coated substrate is baked to evaporate any solvent in the photoresist composition and to fix the photoresist coating onto the substrate. The baked coated surface of the substrate is next subjected to selective radiation; that is, an image-wise exposure to radiation.

This radiation exposure causes a chemical transformation in the exposed areas of the photoresist coated surface. Types of radiation commonly used in microlithographic processes include visible light, ultraviolet (UV) light, electron beam and X-ray radiant energy. After selective exposure, the photoresist coated substrate is treated with a developer solution to dissolve and remove either the radiation-exposed or the unexposed areas of the photoresist.

As the trend toward smaller and smaller semiconductor device dimensions continues, there is a constant demand to improve the methods of fabricating and processing such devices. For example, improvements in lithography techniques lead to thinner gates, smaller vias, thinner lines and higher density devices among other desirable features. Lithography techniques are governed by a number of factors including precision, repeatability, alignment, resolution, uniformity, and the like. Although there are many factors associated with lithography techniques, much attention is devoted to improving resolution.

Resolution is affected, in part, by the thickness of a photoresist coating or layer. Swelling problems, due to interactions between the photoresist and developer in some instances, can be minimized by reducing the thickness of the photoresist. The deleterious effects of electron scattering are also minimized by reducing the thickness of the photoresist. Primarily though, reducing the resist thickness improves the lithography process depth of focus, and thus critical dimension control can be improved using relatively thin photoresists. Therefore, as the thickness of the photoresist layer is reduced, resolution is improved. However, there are limitations associated with making thin photoresist layers. This is because various problems can arise with making thin photoresist layers. One particular problem is defect density or the occurrence of pinholes in thin photoresist layers. Since remediation of pinholes in photoresists is generally not possible, pinholes in photoresist layers constitute unrepairable defects. It is therefore desirable to provide a thin photoresist layer having a low defect density.

Substantial photoresist thickness variations are also frequently encountered when attempts are made to coat a thin photoresist layer over a nonplanar surface, such as a semiconductor substrate having any number of gates or channels therein. The thickness variations in the photoresist layer cause various problems including nonuniform exposure and/or curing, variations in development rate of the exposed photoresist, uneven line width and non-vertical patterned side walls. It is therefore desirable to provide a thin photoresist layer having a minimal thickness variations.

SUMMARY OF THE INVENTION

The present invention provides relatively thin photoresist layers having better surface planarity and/or low defect densities. The present invention also provides methods of reducing pinholes in photoresists. As a result of the present invention, thinner photoresist layers can be used which enables improved critical dimension control during lithography or higher yields.

In one embodiment, the present invention relates to a method of forming a thin photoresist layer having a low defect density, involving the steps of depositing a photoresist layer having a thickness from greater than about 0.5 $\mu$m to about 2 $\mu$m on a semiconductor substrate; and removing at least a portion of the photoresist layer to provide the thin photoresist layer having the low defect density and a thickness from about 0.1 $\mu$m to about 0.5 $\mu$m.

In another embodiment, the present invention relates to a method of reducing pinhole defects in a thin photoresist layer having a thickness below about 0.5 $\mu$m comprising the steps of depositing a layer of the photoresist material having a thickness greater than about 0.5 $\mu$m; and etching at least a portion of the photoresist material to provide the thin photoresist layer having the thickness below about 0.5 $\mu$m, wherein the thickness of the thin photoresist layer is about 90% or less than the thickness of the original layer of the photoresist material.

In yet another embodiment, the present invention relates to a method of processing a semiconductor substrate, involving the steps of providing a semiconductor substrate having a nonplanar surface; optionally depositing an antireflection layer over the semiconductor substrate; spin-coating a photoresist layer having a thickness from about 0.5 $\mu$m to about 2 $\mu$m on the optionally antireflection layer coated semiconductor substrate; and etching the photoresist layer to provide a thin photoresist layer having a thickness from about 0.1 $\mu$m to about 0.5 $\mu$m, wherein the thickness of the thin photoresist layer is smaller than the thickness of the spin-coated photoresist layer.

DISCLOSURE OF INVENTION

Figure 1:
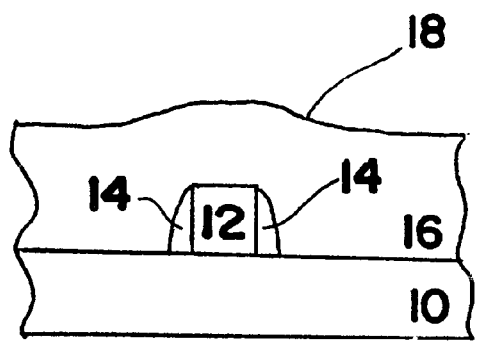
FIG. 1 illustrates a cross-sectional view of the methods according to one aspect of the present invention.

The present invention involves reducing defect density in a thin photoresist layer. The present invention more specifically involves decreasing the thinness of photoresist layers while increasing or maintaining the quality of the photoresist layer. The present invention may be adapted to fabricating various device structures, including active elements, passive elements, polysilicon gates, wordlines, source regions, drain regions, bit lines, bases, emitters, collectors, conductive lines, conductive plugs, etc.

Any photoresist material suitable for making photoresist layers in microlithography techniques may be employed in the methods of the present invention. Photoresists are sensitive (subject to chemical transformation) when exposed energy or light of any suitable wavelength including X-rays, electron beams, ultraviolet (UV) light, visible light and infrared light. Accordingly, photoresists may be subject to chemical transformation upon exposure to light or energy having a wavelength from under 1 nm to about 800 nm, but practically to light or energy having a wavelength from about 190 nm to about 500 nm.

Generally, the photoresist layer is made from organic photoresist materials or inorganic photoresist materials. The photoresist material may be a positive photoresist material or a negative photoresist material. Various types of photoresist materials are commercially available from a number of sources, including Shipley Company, IBM, Arch Chemicals, and Clariant Corporation.

Organic photoresist materials typically are made of a suitable polymeric material, such as a novolak formed from a phenol and formaldehyde, usually with an additional photosensitizer added, such as a quinone-diazide. Examples of organic photoresist materials include organic polymers such as polyesters, polyacrylates, polymethacrylates, polycarbonates, polyimides, polysulfones, polyureas, polystyrenes (including polyhydroxystyrenes), polyaryl ethers, epoxy based polymers, and so on. Organic photoresist materials include materials for making mid UV, deep UV, chemically amplified, E-line, I-line, G-line and H-line photoresists.

Organic photoresist materials are deposited as a dry film or from solution. From solution, organic photoresist materials are roller coated, spin-coated or sprayed (spray coating) on a semiconductor substrate. Alternatively, the semiconductor substrate may be dipped in the organic photoresist material (dip coating). Afterwards, the substrate optionally may be heated to drive off any residual solvent.

Inorganic photoresist materials typically are made of a suitable metallic or glass material. Examples of inorganic photoresist materials include Ge—Se chalcogenide glasses. Inorganic photoresist materials are typically vacuum deposited.

The photoresist material is deposited using any suitable technique (such as those mentioned above) on a suitable semiconductor substrate to a thickness greater than about 0.5 $\mu$m, and typically from about 0.5 $\mu$m to about 2 $\mu$m. In another embodiment, the photoresist material is deposited to a thickness from about 0.5 $\mu$m to about 1 $\mu$m. Initially deposited photoresists having a thickness greater than about 0.5 $\mu$m have a low defect density. In particular, compared to photoresists made of the same materials deposited to a thickness less than 0.5 $\mu$m, photoresists deposited to a thickness greater than about 0.5 $\mu$m have at least one of a markedly lower frequency of pinholes, pinholes of smaller average size, and thicker coatings that are flatter and less influenced by underlying topography.

In embodiments where the semiconductor substrate has a planar surface, the thickness (which is greater than 0.5 $\mu$m) refers to the average thickness of the photoresist material across the surface of the semiconductor substrate. In embodiments where the semiconductor substrate has a nonplanar surface, the thickness refers to the average thickness of the photoresist material over the highest and lowest portions the surface of the semiconductor substrate (average of the thickness over the highest portion of underlying substrate and the thickness over the lowest portion of underlying substrate). For example, in an embodiment where a substrate has a gate thereon, the thickness refers to an average of the thickness from the top of the gate to the top surface of the photoresist layer and the thickness from the substrate surface to the top surface of the photoresist layer. In another embodiment where a substrate has a trench therein, the thickness refers to an average of the thickness from the bottom of the trench to the top surface of the photoresist layer and the thickness from the substrate surface to the top surface of the photoresist layer.

In one embodiment, before depositing the photoresist material, an optional antireflection coating is deposited on the semiconductor substrate. In another embodiment, before depositing the photoresist material, an optional antireflection coating is not deposited on the semiconductor substrate. The semiconductor substrate may include a silicon wafer with or without any semiconductor layer, oxide layer, metal layer, nitride layer, silicide layer, dielectric layer, device (active or passive devices) on the substrate at the time of processing the substrate according to the present invention. When the semiconductor substrate contains gates, lines, holes and/or trenches thereon or therein, the surface of the semiconductor substrate may be nonplanar. In one embodiment, the photoresist material is deposited over a nonplanar semiconductor substrate. In some instances, the semiconductor substrate has a uniform, level or planar surface. Thus, in another embodiment, the photoresist material is deposited over a planar semiconductor substrate.

The initial photoresist layer having a thickness of greater than 0.5 $\mu$m is then reduced according to the invention to a desired thickness using a suitable technique, which varies depending upon the specific identity of the photoresist material used to make the photoresist layer. For example, in embodiments where an organic photoresist material is employed to make the photoresist layer, the initial photoresist layer is reduced to a desired thickness using one of wet etching and dry etching techniques. Wet etching includes contact with an aqueous alkaline solution, such as a hydroxide solution, or a dilute aqueous acid solution for a period of time to reduce the initial photoresist layer to a desired thickness. Wet etching further includes contact with one or more organic solvents. In this embodiment, it is preferable that the photoresist material is partially soluble in the organic solvent(s). Dry etching involves contacting the initial photoresist layer with a reactive oxygen, such as a downstream oxygen plasma, to reduce thickness. In embodiments where an inorganic photoresist material is employed to make the photoresist layer, the initial photoresist layer is also reduced to a desired thickness using one of wet etching and dry etching techniques. Wet etching involves contact with an aqueous alkaline solution, such as a hydroxide solution for a period of time to reduce the initial photoresist layer to a desired thickness. Dry etching involves contacting the initial photoresist layer with a plasma, such as a $CF_4$ plasma, to reduce thickness. The time or duration of contact between the etchant and the initial photoresist layer can be determined by one skilled in the art and generally depends upon the identity of the etchant, the identity of the initial photoresist layer material, the amount of initial photoresist layer material desired to be removed, and the etching conditions.

In one embodiment, the thickness of the resultant thin photoresist layer having a low defect density is from about 0.1 $\mu$m to about 0.5 $\mu$m. In this connection, a thin photoresist layer has a thickness of 0.5 $\mu$m or less. In another embodiment, the thickness of the resultant thin photoresist layer is from about 0.2 $\mu$m to about 0.45 $\mu$m. In yet another embodiment, the thickness of the resultant thin photoresist layer is from about 0.25 $\mu$m to about 0.4 $\mu$m. The top surface of the resultant thin photoresist layer is typically substantially planar.

Low defect density of the resultant thin photoresist layer refers to the relatively small occurrence in defects compared to the occurrence in defects in photoresist layers simply made to a thickness from about 0.1 μm to about 0.5 μm (not according to the methods of the present invention). Low defect density may be characterized or measured by the number of pinhole defects greater than a certain size on a given area of photoresist of a resultant photoresist layer material. In one embodiment, the resultant thin photoresist layer made in accordance with the methods of the present invention has a defect density from about 0.001 to about 10 per $cm^2$ of coated material of pinholes greater than about 0.15 μm in diameter. In another embodiment, the resultant thin photoresist layer made in accordance with the methods of the present invention has a defect density from about 0.01 to about 1 per $cm^2$ of coated material of pinholes greater than about 0.15 μm in diameter.

Resultant photoresist layers having a low defect density and thicknesses from about 0.1 μm to about 0.5 μm made in accordance with the methods of the present invention are particularly useful for lithography techniques required to form structures having dimensions on the order of about 0.35 μm, about 0.25 μm, about 0.18 μm, about 0.15, about 0.13 μm, about 0.1 μm and/or about 0.05 μm, that is, structures having dimensions from about 1 μm to about 0.1 μm.

The thickness of the resultant photoresist layer is smaller than the thickness of the initially deposited photoresist material. In one embodiment, the thickness of the resultant photoresist layer is about 90% or less than the thickness of the initially deposited photoresist material. In another embodiment, the thickness of the resultant photoresist layer is about 80% or less than the thickness of the initially deposited photoresist material. In yet another embodiment, the thickness of the resultant photoresist layer is about 70% or less than the thickness of the initially deposited photoresist material. In still yet another embodiment, the thickness of the resultant photoresist layer is about 60% or less than the thickness of the initially deposited photoresist material. In another embodiment, the thickness of the resultant photoresist layer is about 50% or less than the thickness of the initially deposited photoresist material.

After the thin photoresist layer is made in accordance with the present invention on a substrate, further processing may be performed; that is, the thin photoresist layer is selectively exposed to energy or light. After selective exposure, the thin photoresist layer coated substrate is treated with a developer solution to dissolve and remove either the radiation-exposed or the unexposed areas of the photoresist. Additive or subtractive (material deposition or etching) is then performed on the exposed areas of the substrate. The remaining or patterned photoresist is then typically removed (stripped).

Figure 2:
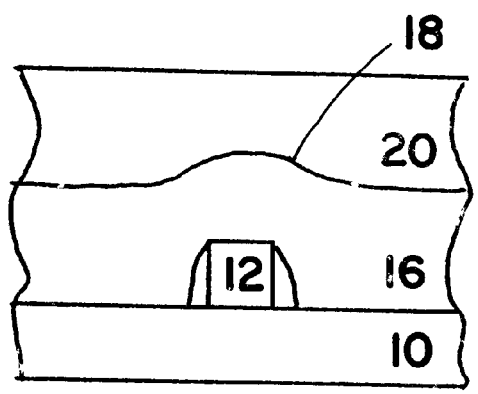
FIG. 2 illustrates a cross-sectional view of the methods according to one aspect of the present invention.
Figure 3:
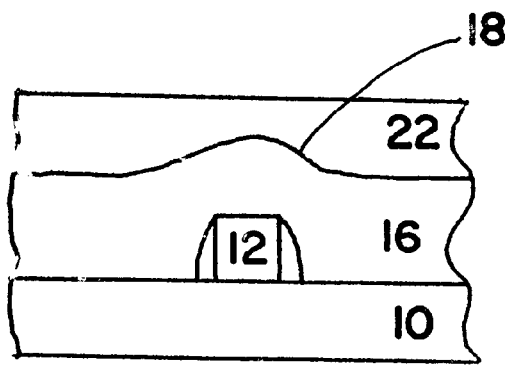
FIG. 3 illustrates a cross-sectional view of the methods according to one aspect of the present invention.

Referring to FIGS. 1 to 3, the methods of the present invention are illustrated as follows. Referring to FIG. 1, a semiconductor substrate 10 is provided having a polysilicon gate 12 thereon. Oxide spacers 14 are located on each side of the polysilicon gate 12. The oxide spacers 14 and the polysilicon gate 12 may be formed using any suitable technique. Dielectric layer 16 is provided over the semiconductor substrate 10 and the polysilicon gate 12. Dielectric layer 16 may include any suitable dielectric material or materials. Suitable dielectric materials include silicon dioxide, silicon nitride, silicon oxynitride, phosphosilicate glass, borophosphosilicate glass, or any suitable spin-on glass. Dielectric layer 16 may be formed to any suitable thickness using any suitable technique that may depend, for instance, on the material or materials used. The structure described in FIG. 1 contains a nonplanar surface 18.

Referring to FIG. 2, a suitable photoresist material is deposited by a suitable technique to a thickness greater than 0.5 μm on nonplanar surface 18 over the dielectric layer 16 to form an initial photoresist layer 20. Although not shown, an antireflection coating optionally may be deposited over the dielectric layer 16 in which case the photoresist material is deposited over the antireflection coating. In this embodiment, the photoresist material is a deep UV photoresist deposited to a thickness of about 0.8 μm by spin-coating.

Referring to FIG. 3, an appropriate subtractive etching process is performed to remove portions of the initial photoresist layer 20 to provide a thin photoresist layer 22 having a thickness of about 0.5 μm or less. In this embodiment, a blanket dry etch using oxygen plasma is performed to provide a thin photoresist layer 22 having a thickness of about 0.35 μm.

The low defect density of the resultant photoresist layers made in accordance with the present invention have a number of advantages over conventionally made photoresist layers in that at least one of more precise exposure and resultant patterning is achieved, uniform development rate of the exposed photoresist layer, smaller patterning without defects in the patterned photoresist layers is realized, finer patterns are realized, and uniform patterns are realized. Moreover, when using a contact mask pattern, very small contact holes can be printed in the photoresist layer.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a thin photoresist layer having a low defect density, comprising:

depositing a photoresist layer having a thickness from about 0.5 μm to about 2 μm on a semiconductor substrate; and removing at least a portion of the photoresist layer to provide the thin photoresist layer having the low defect density and a thickness from about 0.1 μm to about 0.5 μm, wherein the at least a portion of the photoresist layer has not been exposed to exposing radiation.

2. The method of claim 1, wherein the photoresist layer has a thickness from greater than about 0.5 μm to about 1 μm and the thin photoresist layer has a thickness from about 0.2 μm to about 0.45 μm.

3. The method of claim 1, wherein the portion of the photoresist layer is removed by one of dry etching or wet etching.

4. The method of claim 1, wherein the photoresist layer comprises one of a deep UV photoresist material, a chemically amplified photoresist material, an E-line photoresist material, an I-line photoresist material, a G-line photoresist material or an H-line photoresist material.

5. The method of claim 1, wherein the photoresist layer is deposited using spin-coating techniques.

6. The method of claim 1, wherein the thin photoresist layer has a defect density from about 0.001 to about 10 per $cm^2$ of the thin photoresist layer of pinholes greater than about 0.15 $\mu$m in diameter.

7. The method of claim 1, wherein the semiconductor substrate has a nonplanar surface.

8. The method of claim 1, further comprising, after the removing, exposing the thin photoresist layer to irradiation and developing the thin photoresist layer.

9. The method of claim 1, wherein the removing includes dry etching the at least a portion of the photoresist layer.

10. The method of claim 9, wherein the dry etching includes plasma etching.

11. The method of claim 10, wherein the plasma etching includes etching with reactive oxygen.

12. The method of claim 1, further comprising depositing an antireflection layer over the semiconductor substrate prior to the depositing the photoresist layer.

13. A method of reducing pinhole defects in a thin photoresist layer having a thickness below about 0.5 $\mu$m comprising a photoresist material, comprising:
  depositing a layer of the photoresist material having a thickness greater than about 0.5 $\mu$m; and
  dry etching at least a portion of the photoresist material to provide the thin photoresist layer having the thickness below about 0.5 $\mu$m, wherein the thickness of the thin photoresist layer is about 90% or less than the thickness of the layer of the photoresist material.

14. The method of claim 13, wherein the photoresist material has a thickness from greater than about 0.5 $\mu$m to about 1 $\mu$m and the thin photoresist layer has a thickness from about 0.2 $\mu$m to about 0.45 $\mu$m.

15. The method of claim 13, wherein the photoresist material comprises one of a polyester, a polyacrylate, a polymethacrylate, a polycarbonate, a polyimide, a polysulfone, a polyurea, a polystyrene, a polyaryl ether, an epoxy based polymer, or a quinone-diazide.

16. The method of claim 13, wherein etching is performed using reactive oxygen.

17. The method of claim 13, wherein the thin photoresist layer has a defect density from about 0.01 to about 1 per $cm^2$ of the thin photoresist layer of pinholes greater than about 0.15 $\mu$m in diameter.

18. The method of claim 13, wherein the at least a portion of the photoresist material has not been exposed to exposing radiation.

19. The method of claim 18, further comprising, after the etching, exposing the thin photoresist layer to irradiation and developing the thin photoresist layer.

20. The method of claim 13, wherein the depositing the layer of the photoresist material includes depositing the layer on a nonplanar surface of a semiconductor substrate.

21. The method of claim 20, further comprising depositing an antireflection layer over the semiconductor substrate prior to the depositing the layer of the photoresist layer.

22. A method of processing a semiconductor substrate, comprising:
  providing a semiconductor substrate having a nonplanar surface;
  spin-coating a photoresist layer having a thickness from about 0.5 $\mu$m to about 2 $\mu$m on the nonplanar surface of the semiconductor substrate; and
  etching the photoresist layer to provide a thin photoresist layer having a thickness from about 0.1 $\mu$m to about 0.5 $\mu$m, wherein the thickness of the thin photoresist layer is smaller than the thickness of the spin-coated photoresist layer.

23. The method of claim 22, wherein the spin-coated photoresist layer has a thickness from greater than about 0.5 $\mu$m to about 1 $\mu$m and the thin photoresist layer has a thickness from about 0.25 $\mu$m to about 0.4 $\mu$m.

24. The method of claim 22, wherein the photoresist layer is etched by one of dry etching or wet etching.

25. The method of claim 22, wherein etching is performed using an aqueous hydroxide solution.

26. The method of claim 22, wherein the photoresist layer comprises a deep UV photoresist.

27. The method of claim 22 further comprising exposing the thin photoresist layer to irradiation and developing the thin photoresist layer.

28. The method of claim 27, wherein the exposing and the developing are subsequent to the etching.

29. The method of claim 28, wherein the etching includes etching photoresist that has not been exposed to exposing radiation.

30. The method of claim 29, wherein the etching includes dry etching.

31. The method of claim 30, wherein the dry etching includes plasma etching.

32. The method of claim 31, wherein the plasma etching includes etching with reactive oxygen.

33. The method of claim 22, further comprising, subsequent to the providing and prior to the spin-coating, depositing an antireflection layer over the semiconductor substrate, wherein the spin-coating includes depositing the photoresist layer on the antireflection layer.

* * * * *

UNITED STATES PATENT AND TRADEMARK OFFICE
CERTIFICATE OF CORRECTION

PATENT NO. : 6,350,559 B1 Page 1 of 1
DATED : February 26, 2002
INVENTOR(S) : Templeton et al.

It is certified that error appears in the above-identified patent and that said Letters Patent is hereby corrected as shown below:

Column 1,
Line 67, replace "1he" with -- The --

Signed and Sealed this

Thirtieth Day of July, 2002

*Attest:*

*Attesting Officer*

JAMES E. ROGAN
*Director of the United States Patent and Trademark Office*